(12) United States Patent
Li (10) Patent No.: US 11,894,087 B2
(45) Date of Patent: Feb. 6, 2024

(54) TEST CIRCUIT

(71) Applicant: ChangXin Memory Technologies, Inc., Hefei (CN)

(72) Inventor: MinNa Li, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 274 days.

(21) Appl. No.: 17/440,114

(22) PCT Filed: Jul. 7, 2021

(86) PCT No.: PCT/CN2021/105067
§ 371 (c)(1),
(2) Date: Sep. 16, 2021

(87) PCT Pub. No.: WO2022/166107
PCT Pub. Date: Aug. 11, 2022

(65) Prior Publication Data
US 2023/0197179 A1    Jun. 22, 2023

(30) Foreign Application Priority Data
Feb. 5, 2021   (CN) .......................... 202110160891.7

(51) Int. Cl.
*G11C 29/38* (2006.01)
*G11C 29/18* (2006.01)

(52) U.S. Cl.
CPC .............. *G11C 29/38* (2013.01); *G11C 29/18* (2013.01)

(58) Field of Classification Search
None
See application file for complete search history.

(56) References Cited

U.S. PATENT DOCUMENTS 5,783,958 A * 7/1998 Lysinger .............. H03K 3/0372
                                                      327/403
2003/0085731 A1* 5/2003 Iwase ..................... G11C 29/46
                                                      326/16

(Continued)

FOREIGN PATENT DOCUMENTS

CN          1303101 A       7/2001
CN       102956272 B       10/2015

OTHER PUBLICATIONS

"IEEE Standard for Test Access Port and Boundary-Scan Architecture," in IEEE Std 1149.1-2013 (Revision of IEEE Std 1149.1-2001), vol., No., pp. 1-444, May 13, 2013, doi: 10.1109/IEEESTD.2013.6515989. (Year: 2013).*

(Continued)

*Primary Examiner* — Daniel F. McMahon
(74) *Attorney, Agent, or Firm* — Alston & Bird LLP (57) ABSTRACT

The disclosed test circuit includes: an input terminal, a processing circuit, and an output terminal. The input terminal receives an input signal. The input signal includes a test command for indicating a test target circuit module and an address of the target circuit module. The processing circuit responds to the test command and the target. The address of the circuit module determines the test mode signal, the test mode signal carries the test type, the test mode signal is used to trigger the target circuit module to perform the test corresponding to the test type, and the output terminal sends the test mode signal to the target circuit module according to the address of the target circuit module. Thus, the test mode signal can be accurately transmitted to different circuit modules in the memory chip.

20 Claims, 12 Drawing Sheets

(56) References Cited

U.S. PATENT DOCUMENTS

| 2008/0089167 A1* | 4/2008 | Dono | G11C 29/44 |
| | | | 365/233.5 |
| 2009/0231947 A1* | 9/2009 | Lee | G11C 8/06 |
| | | | 365/201 |
| 2012/0131397 A1* | 5/2012 | Yoshida | G11C 29/16 |
| | | | 714/E11.159 |

OTHER PUBLICATIONS

PCT/CN2021/105067 International Search Report and Written Opinion dated Nov. 4, 2021, English translation.

* cited by examiner

TEST CIRCUIT

CROSS REFERENCES TO RELATED APPLICATIONS

This application claims the priority of the Chinese patent application CN202110160891.7 filed with the Chinese Patent Office on Feb. 5, 2021, entitled "TEST CIRCUIT", the entire content of which is incorporated herein by reference in its entirety.

TECHNICAL FIELD

The present application is in the field of electronics, in particular, is related to a test circuit, but is not limited to one test circuit.

BACKGROUND

Generally, in order to improve the reliability of memory chips (integrated circuits), memory chips need to undergo a series of tests before they leave the factory, these tests are for the functions and timings of the memory chips, and for finding out if the voltages generated by the voltage generating module in the memory chip are accurate, and so on, in addition, for performing voltage or resistance adjustments by testing some of the circuits in the memory chip.

The above tests all require sending the corresponding test mode signal to the circuit modules in the memory chip to trigger the circuit modules for testing. However, the number of circuit modules in the memory chip is large, and the test mode signals of different circuit modules are different. Different circuit modules accurately transmit test mode signals, which is a problem that needs to be solved urgently.

SUMMARY

An embodiment of the present application provides a test circuit, including:

An input terminal, a processing circuit and an output terminal.

Herein, the input terminal receives an input signal, and the input signal includes a test command tor instructing a test target circuit module and an address of the target circuit module.

The processing circuit is configured to determine a test mode signal according to the test command and the address of the target circuit module, wherein the test mode signal carries a test type, and the test mode signal triggers the target circuit module to perform the test corresponding to the test type.

The output terminal sends the test mode signal to the target circuit module according to the address of the target circuit module.

Another embodiment of the present application provides a memory, including a control circuit, at least one circuit module, and the test circuit described in the first embodiment according to any one of the possible implementations of the first embodiment.

The control circuit sends the input signal to the test circuit; and

The test circuit receives the input signal, and sends the test erode signal to one of the at least one circuit module according to the input signal.

BRIEF DESCRIPTION OF THE DRAWINGS

In order to more clearly explain the technical solutions in the present application or the prior art, the following will briefly introduce the drawings that need to be used in the description of the embodiments or the prior art. Obviously, the drawings in the following description are of the present invention. For some of the embodiments of the application, for those of ordinary skill in the art, other drawings can be obtained based on these drawings without creative labor.

DETAILED DESCRIPTION OF THE PREFERRED EMBODIMENTS

In order to make the purpose, technical solutions and advantages of this application clearer, the technical solutions in this application will be described clearly and completely in conjunction with the accompanying drawings in this application. Obviously, the described embodiments are part of the embodiments of this application not including all examples. Based on the embodiments in this application, all other embodiments obtained by those of ordinary skill in the art without creative work shall fall within the protection scope of this application.

The test circuit provided by the embodiment of the present application can be applied to a memory chip or an integrated circuit. It is understood that the memory chip is a miniaturized integrated circuit, and the test circuit provided by the embodiment of the present application can also be applied to a non-miniaturized integrated circuit. The test circuit provided by the embodiment of the present application can be applied to a memory chip or an integrated circuit including at least one circuit module.

Figure 1:
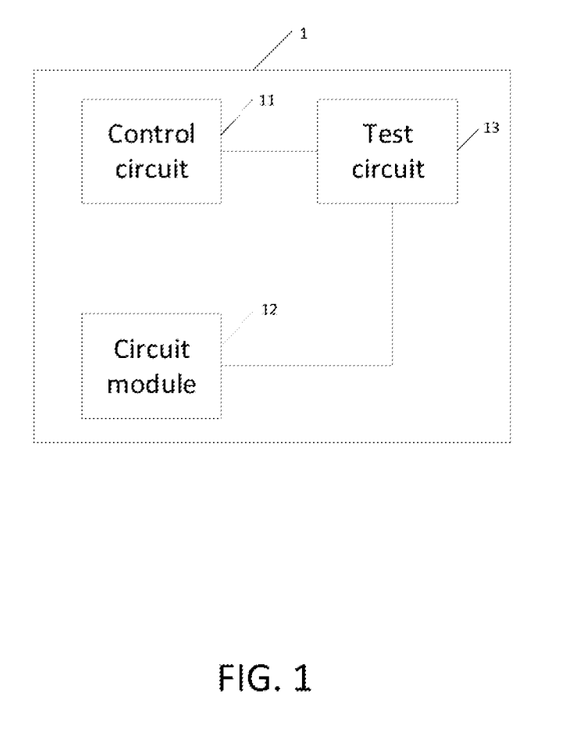
FIG. 1 is a schematic diagram of an application scenario of a test circuit provided by an embodiment of the application.

FIG. 1 is a schematic diagram of an application scenario of a test circuit provided by an embodiment of the application. As shown in FIG. 1, the application scenario of the test circuit provided by an embodiment of the application involves a memory chip 1. The memory chip 1 includes a control circuit 11, and at least one circuit module 12 and test circuit 13. It is understandable that there may be multiple circuit modules 12 in the memory chip 1, and different circuit modules 12 are responsible for different functions. When performing a series of tests on the memory chip 1 before leaving the factory, it is necessary to send corresponding test mode signals to the memory chip in the circuit module 12, to perform corresponding functional tests to trigger circuit module 12. However, the number of circuit modules 12 in the memory chip 1 is large, and the test mode signals of different circuit modules 12 are different. How to transmit test mode signals to different circuit modules accurately has become an issue.

To solve this problem, the present application provides a test circuit 13, which receives an input signal sent by the control circuit 11. The input signal includes a test command for indicating a test target circuit module and an address of the target circuit module. The test circuit 13 sends the test mode signal to the corresponding target circuit module according to the input signal, thereby triggering the target circuit module to perform the corresponding functional test, thereby realizing the accurate transmission of the test mode signal to different circuit modules. It should be noted that the application scenario shown in FIG. 1 is only an example, and does not constitute a limitation on the application scenario of the test circuit of the present application.

The structure of the test circuit of the present application will be described below in conjunction with embodiments, and the structure of the test circuit here is not limited to any of the following exemplary structures.

Figure 2:
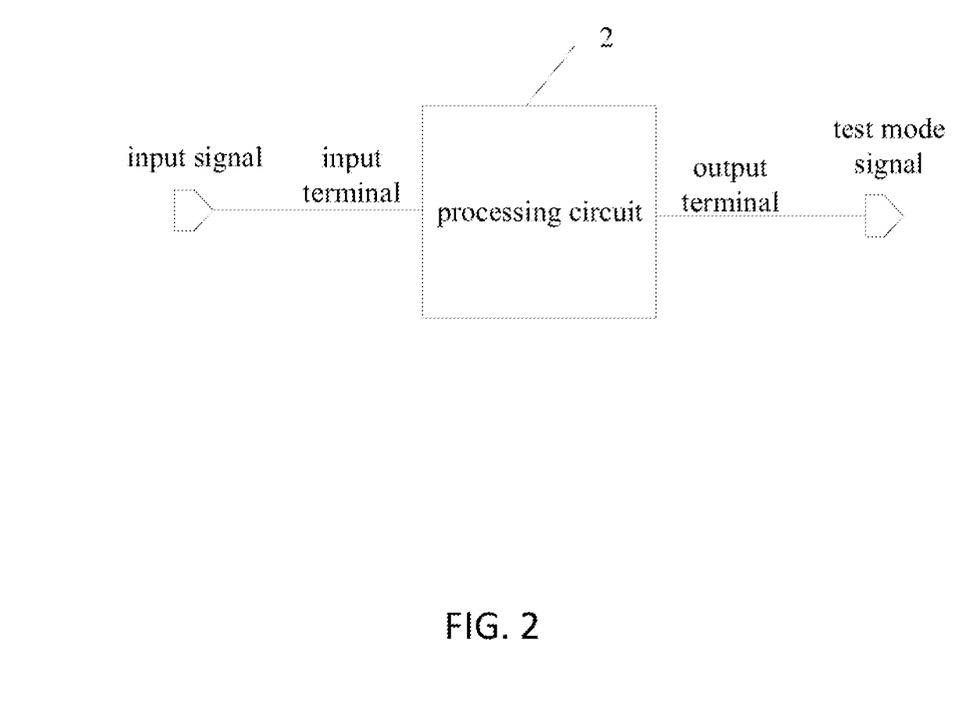
FIG. 2 is a schematic structural diagram of a test circuit provided by an embodiment of the application.

FIG. 2 is a schematic structural diagram of a test circuit provided by an embodiment of the application. As shown in FIG. 2, the test circuit of this embodiment may include: a processing circuit 2 having an input terminal and an output terminal, wherein the input terminal receives an input signal, which includes a test command for instructing the test target circuit module and the address of the target circuit module.

The processing circuit 2 determines a test mode signal according to the test command and the address of the target circuit module, the test mode signal carries information about the test type, and the test mode signal triggers the target circuit module to perform a test corresponding to the test type.

Among the test types, there can be, for example, a function test, a timing test, or a voltage test of the memory chip, and the voltage test can verify whether the voltage generated by the voltage generating, module is accurate.

The output terminal sends the test mode signal to the target circuit module according to the address of the target circuit module.

The test circuit provided in this embodiment includes a processing circuit having an input terminal and an output terminal. The input terminal receives an input signal including a test command for indicating a test target circuit module and an address of the target circuit module. The processing circuit communicates with the target circuit according to the test command. The address of the module determines the test mode signal, the determined test mode signal triggers the target circuit module to perform a test corresponding to the test type, and the output terminal sends the test mode signal to the target circuit module according to the address of the target circuit module. Therefore, the test circuit can accurately transmit the test mode signal to different circuit modules, and the circuit module can be triggered to perform a test corresponding to the test type carried by the test mode signal.

The structure of the processing circuit 2 shown in FIG. 2 will be described below with reference to FIGS. 3 to 5.

Figure 3:
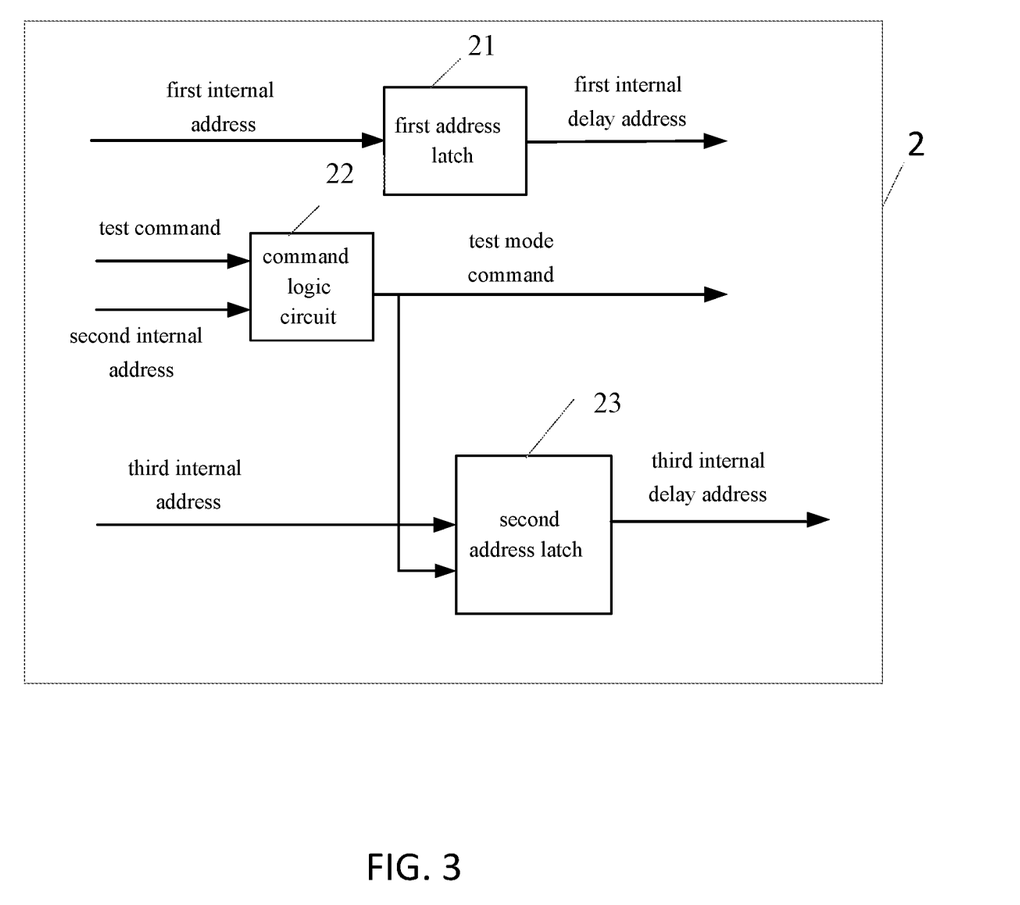
FIG. 3 is a schematic structural diagram of a test circuit provided by an embodiment of the application.

In an implementable example, FIG. 3 shows a schematic structural diagram of a test circuit provided by an embodiment of this application. As shown in FIG. 3, in the test circuit of this embodiment, the processing circuit 2 may include: a first address latch 21, a command logic circuit 22, and the second address latch 23, wherein the first address latch 21 receives the first internal address and outputs the first internal delay address. It can be understood that the first internal delay is caused by the first internal address delayed by a preset time. The command logic circuit 22 receives a test command and a second internal address, and outputs a test mode command. The second address latch 23 is used to receive the third internal address and the test mode command, and output the third internal delay address.

Figure 4:
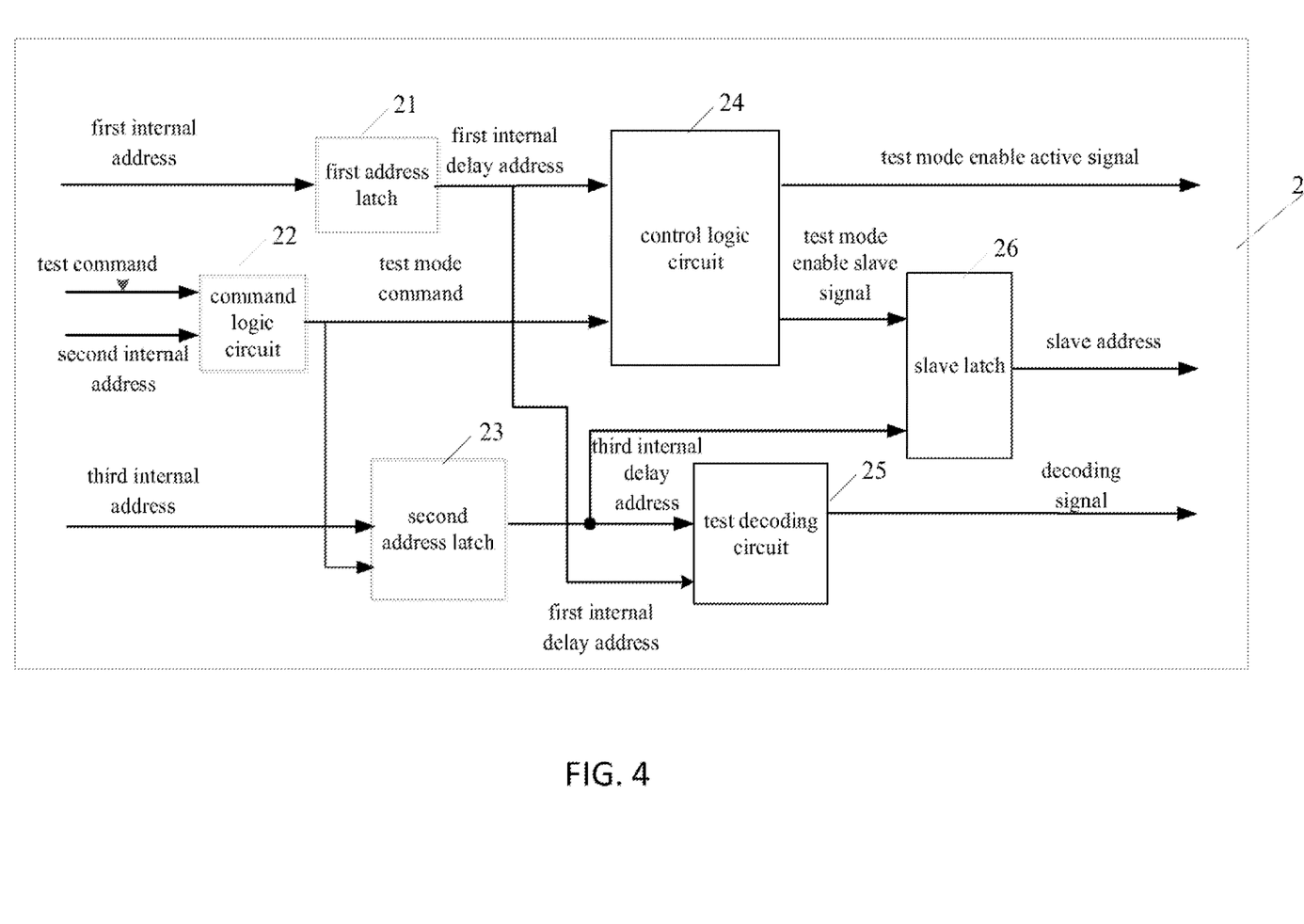
FIG. 4 is a schematic structural diagram of a test circuit provided by an embodiment of the application.

In an implementable example, FIG. 4 is a schematic structural diagram of a test circuit provided by an embodiment of this application. As shown in FIG. 4, the test circuit of this embodiment is based on the test circuit shown in FIG. 3, and further, may also include: a control logic circuit 24, a test decoding circuit 25, and a slave latch 26, where the control logic circuit 24 receives the first internal delay address and the test mode command, and outputs the test mode enable active signal and test mode enables a slave signal.

The test decoding circuit 25 receives the first internal delay address and the third internal delay address, and outputs a decoding signal.

The slave latch 26 receives the third internal address and the test mode enable slave signal, and outputs the slave address.

Figure 5:
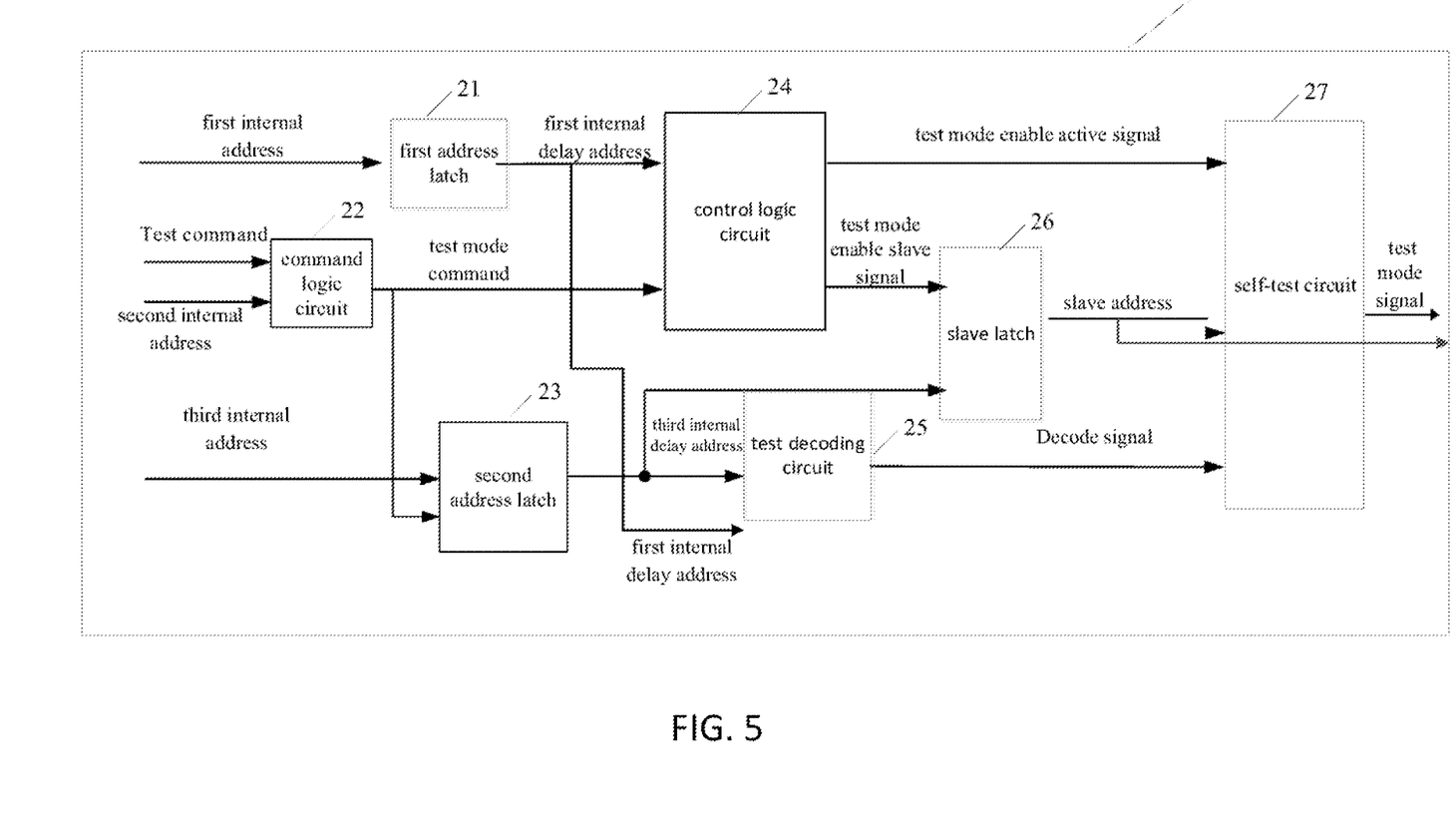
FIG. 5 is a schematic structural diagram of a test circuit provided by an embodiment of the application.

As an implementable example, FIG. 5 is a schematic structural diagram of a test circuit provided by an embodiment of the application. As shown in FIG. 5, the test circuit of this embodiment is based on the test circuit shown in FIG. 4. It may also include a self-test circuit 7, which receives the test mode enable active signal, the slave address, and the decode signal, and outputs the test mode signal to the target circuit module.

In some embodiments, the coma and logic circuit 22 is used to: generate a test mode command according to the test command, when the value of the second internal address is a preset value. For example, if the preset value is 1, the command logic circuit 22 has the value 1 at the second internal address, it generates the test mode command according to the test command.

In some embodiments, the control logic circuit 24 is used to: when the value of the first internal delay address is the first value, perform a logical operation with the test mode command to generate the test mode enable active signal; when the first internal delay address is the second value, logic operation is performed with the test mode command to generate the test mode enable slave signal. For example, when the first value is "00/01/10", the control logic circuit 24 is used to perform an AND operation with the test mode command after inverting "00/01/10" to generate a test mode enable active signal. When the second value is "11", the control logic circuit 24 is used to perform an AND operation on the "11" with the test mode command to generate the test mode enable slave signal.

In an implementable example, the test decoding circuit 25 may include multiple decoders. Optionally, the decoder may include 3-8 decoders or 4-16 decoders. The 3-8 decoder is an example to show a structure of test decoding circuit.

Figure 6:
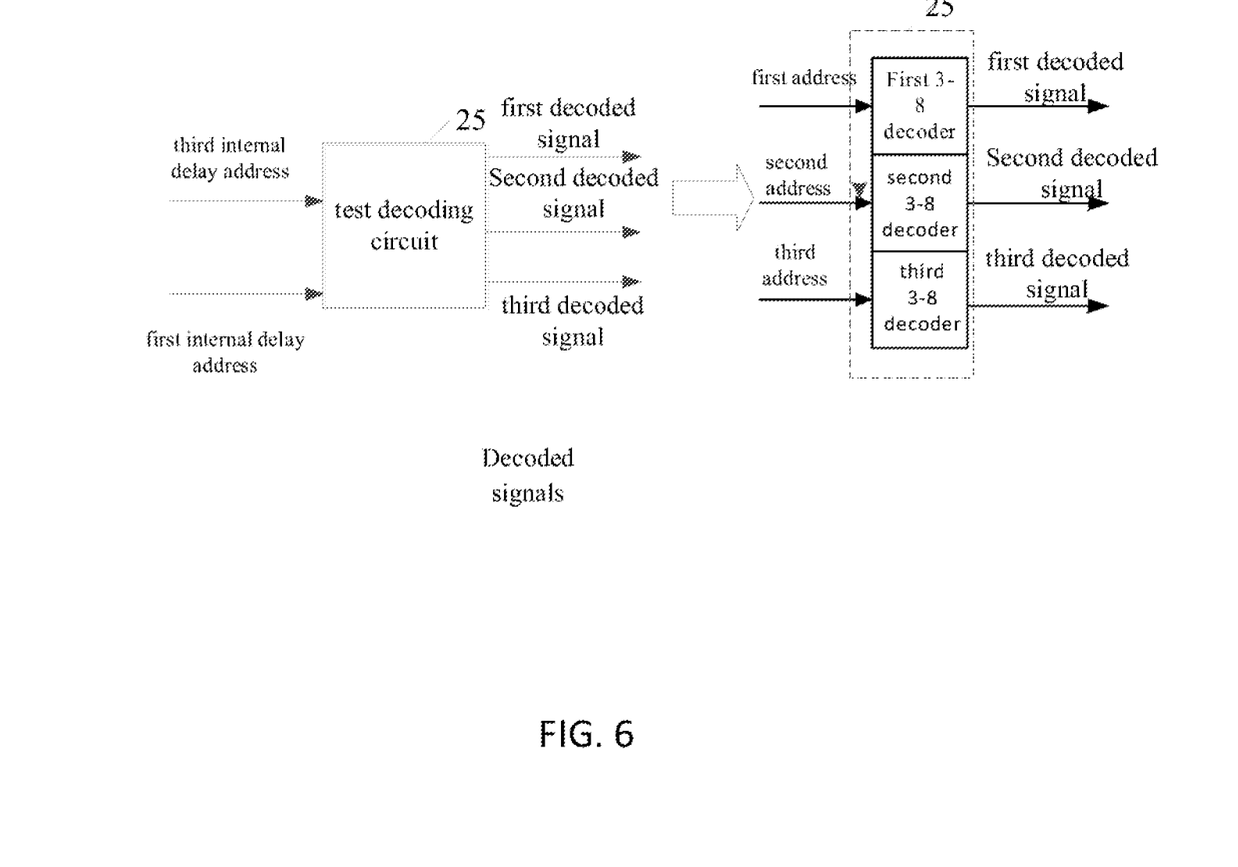
FIG. 6 is a schematic structural diagram of a test decoding circuit provided by an embodiment of the application.

FIG. 6 is a schematic structural diagram of a test decoding circuit provided by an embodiment of the application. As shown in FIG. 6, the test decoding circuit of this embodiment includes three 3-8 decoders: the first 3-8 decoder, the second 3-8 decoder, and the third 3-8 decoder. The three 3-8 decoders are used to receive the first internal delay address and the third internal delay address. Correspondingly, the decoded signal includes the first decoded signal, a second decoded signal, and a third decoded signal. If the first internal address is 2 bits (RAT <1:0>) and the third internal address is 7 bits (RAD<6:0>), correspondingly, the first 3-8 decoder receives the first address: 3 Bit (RAD<2:0>), and outputs the first decoded signal; the second 3-8 decoder receives the second address: 3 bits (RAD<5:3>), and outputs the second decoded signal; the third 3-8 decoder receives the third address: 3 bits (RAT<1:0> and RAD<6>), and outputs the third decoded signal.

Figure 7:
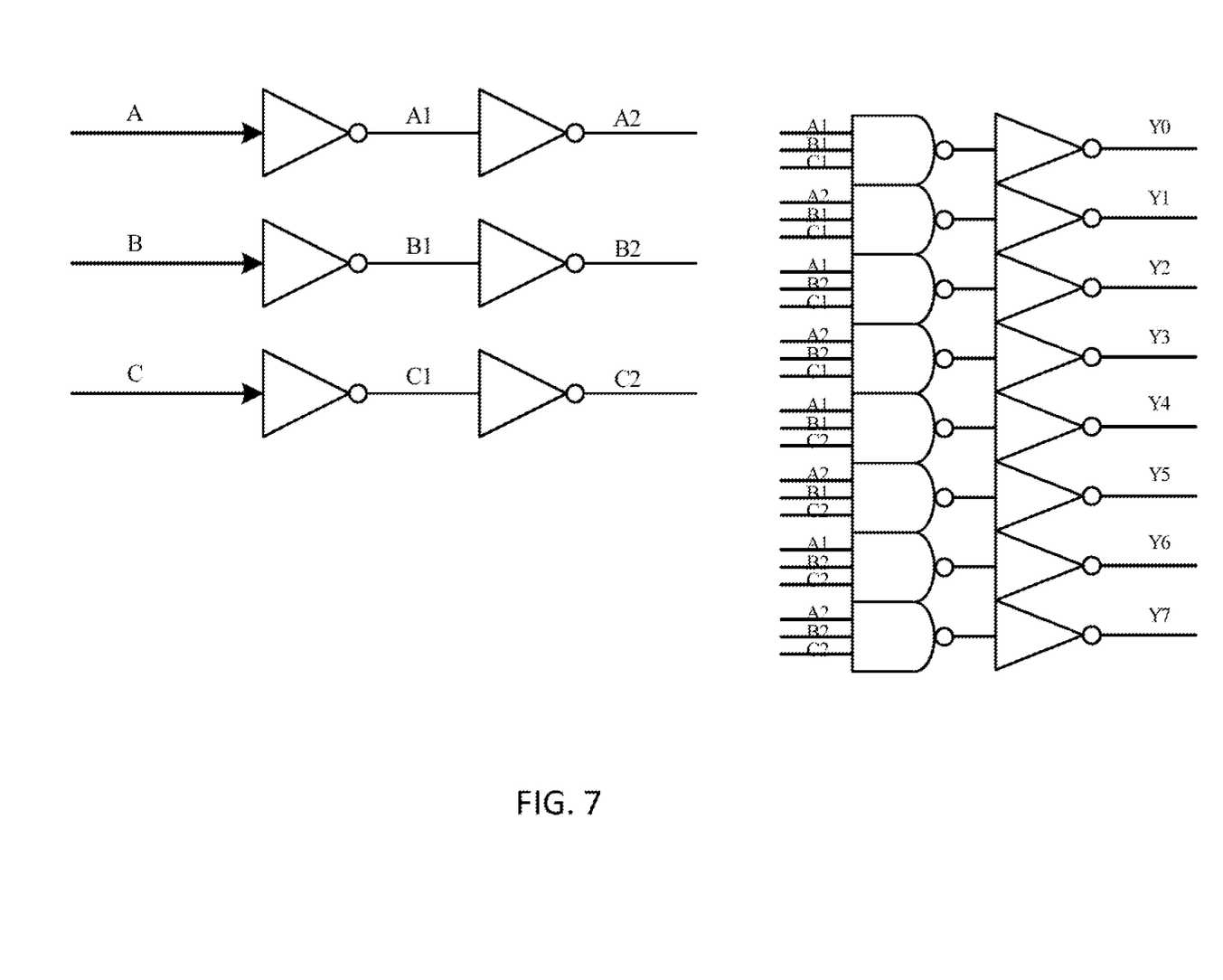
FIG. 7 is a schematic diagram of the internal structure of 3-8 decoders.

FIG. 7 is a schematic diagram of the internal structure of a 3-8 decoder. As shown in FIG. 7, a 3-8 decoder includes 3 input ports (A, B and C) on the left and 8 output ports (Y0-Y7) on the right. Each input port is connected to two inverters in series.

The structure of the control logic circuit will be described in detail below in conjunction with FIG. 8.

Figure 8:
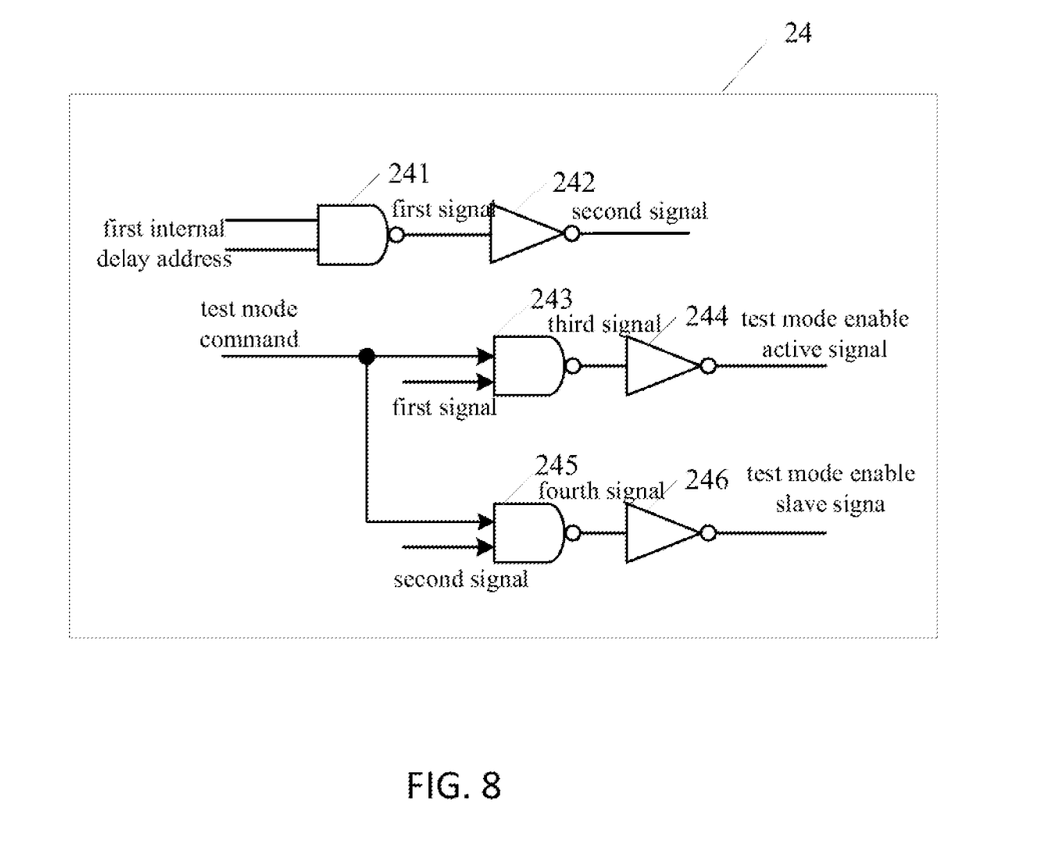
FIG. 8 is a schematic structural diagram of a control logic circuit provided by an embodiment of the application.

As an implementable manner, FIG. 8 is a schematic structural diagram of a control logic circuit provided by an embodiment of this application. As shown in FIG. 8, the control logic circuit of this embodiment may include the first NAND gate 241, the first inverter 242, the second NAND gate 243, the second inverter 244, the third NAND gate 245, and the third inverter 246, wherein the output terminal of the first NAND gate 241 and the input terminal of the first inverter 242 are connected, the output terminal of the second NAND gate 243 and the input terminal of the second inverter 244 are connected, and the output terminal of the third NAND gate 245 and the input terminal of the third inverter 246 are connected.

The first NAND gate 241 receives the first internal delay address and outputs the first signal. The first inverter 242 receives the first signal and outputs the second signal.

The second NAND gate 243 receives the first signal and the test mode command, and outputs the third signal. The second inverter 244 receives the third signal and outputs the test mode enable active signal. The third NAND gate 245 receives the second signal and the test mode command, and output the fourth signal. The third inverter 246 receives the fourth signal and outputs the test mode enable slave signal.

The self-test circuit structure will be described in detail below in conjunction with FIG. 9.

Figure 9:
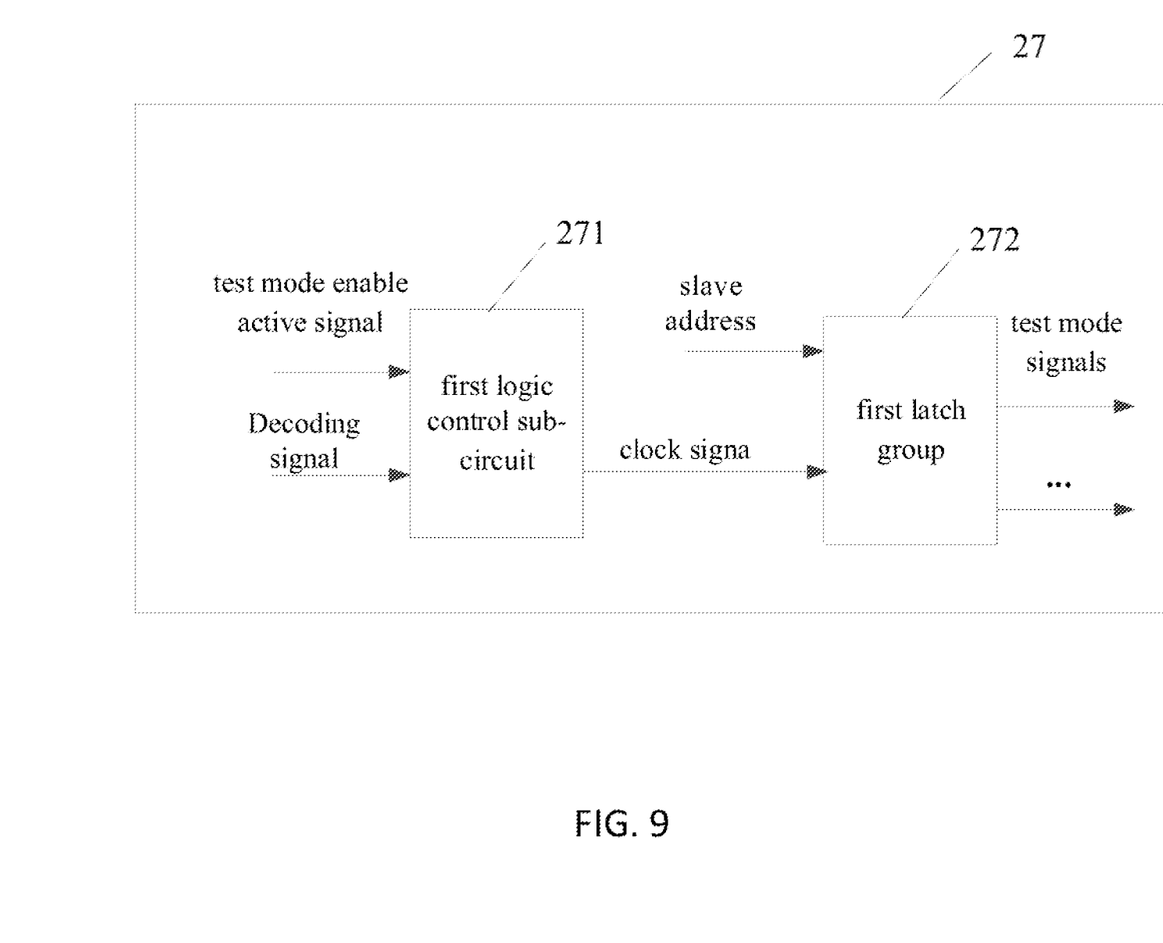
FIG. 9 is a schematic structural diagram of a self-test circuit provided by an embodiment of the application.

In an implementable example, FIG. 9 is a schematic structural diagram of a self-test circuit provided by an embodiment of this application. As shown in FIG. 9, the self-test circuit of this embodiment may include a first test sub-circuit. A test sub-circuit includes a first logic control sub-circuit 271 and a first latch group 272. The first logic control sub-circuit 271 is connected to the first latch group 272. Each latch of the first latch group 272 corresponds to one test mode signals. It can be understood that the self-test circuit may include a plurality of first test sub-circuits.

In an implementable example, the input terminal of the first logic control sub-circuit 271 is connected to the output terminal of the control logic circuit 24, the output terminal of the test decoding circuit 25, and the output terminal of the slave latch 26.

The first logic control sub-circuit 271 is configured to perform logic operations according to the test mode enable active signal and the decoded signal, generate a clock signal, and output the clock signal to the first latch group 272.

The first latch group 272 receives the slave address and the clock signal, generates a test mode signal according to the slave address and the clock signal, and outputs the test mode signal to the target circuit module.

Figure 10:
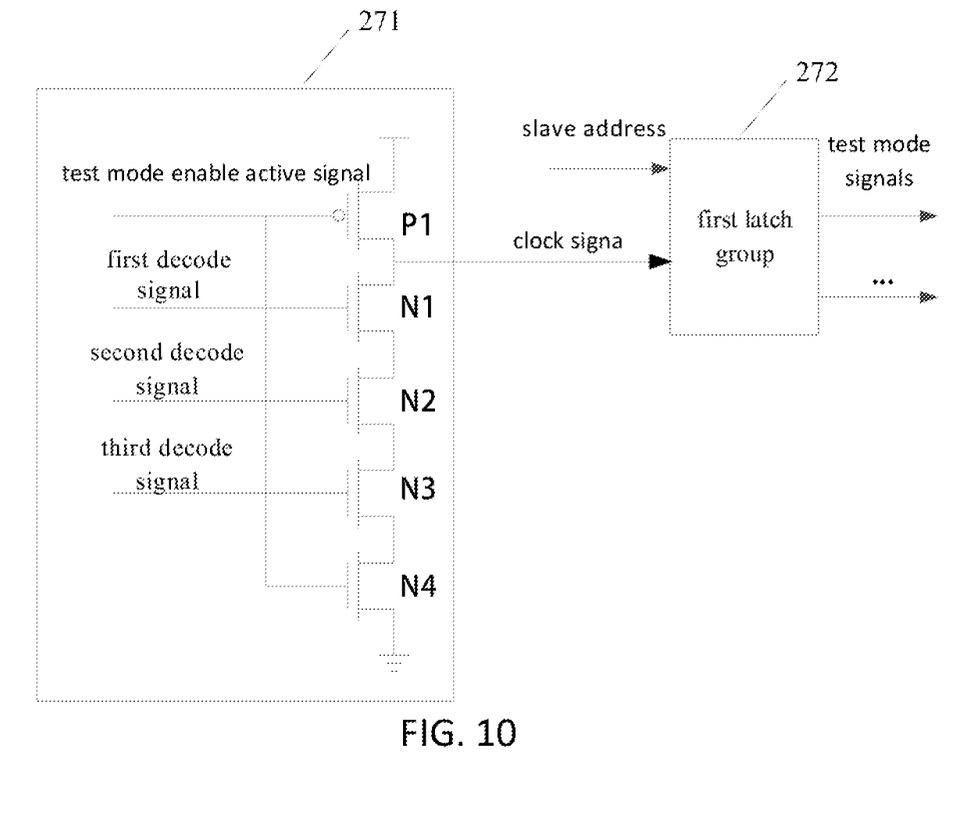
FIG. 10 is a schematic structural diagram of a first test sub-circuit provided by an embodiment of the application.

In an implementable example, FIG. 10 is a schematic structural diagram of a first test sub-circuit provided by an embodiment of this application. As shown in FIG. 10, the first test sub-circuit in this embodiment includes a first logic control sub-circuit 271 and the first latch group 272, wherein the first logic control sub-circuit 271 includes a first P-type transistor P1, a first N-type transistor N1, a second N-type transistor N2, a third N-type transistor N3, and a fourth N-type transistor N4.

The control terminal of the first P-type transistor P1 is connected to the output terminal of the control logic circuit 24, the first terminal of the first P-type transistor P1 is connected to the power supply terminal, and the second terminal of the first P-type transistor P1 is connected to the input terminal of the first latch group and the first terminal of the first N-type transistor N1.

The control terminal of the first N-type transistor N1, the control terminal of the second N-type transistor N2, and the control terminal of the third N-type transistor N3 are all connected to the output terminal of the test decoding circuit 25. In some embodiments, the control terminal of the first N-type transistor N1 receives the first decoding signal, the control terminal of the second N-type transistor N2 receives the second decoding signal, and the control terminal of the third N-type transistor N3 receives the third decoding signal.

The second terminal of the first N-type transistor N1 is connected to the first terminal of the second N-type transistor N2, the second terminal of the second N-type transistor N2 is connected to the first terminal of the third N-type transistor N3, and the second terminal of the third N-type transistor N3 is connected to the first terminal of the fourth N-type transistor N4.

The control terminal of the fourth N-type transistor N4 is connected to the output terminal of the control logic circuit, the first terminal of the fourth N-type transistor N4 is connected to the second terminal of the third N-type transistor N3, and the second terminal of the fourth N-type transistor N4 is connected to the ground.

In the above embodiment, optionally, the first internal address can be 2 bits (A<1:0>), the second internal address can be 1 bit (A<7>), and the third internal address can be 7 bits (A<7:0>).

Figure 11:
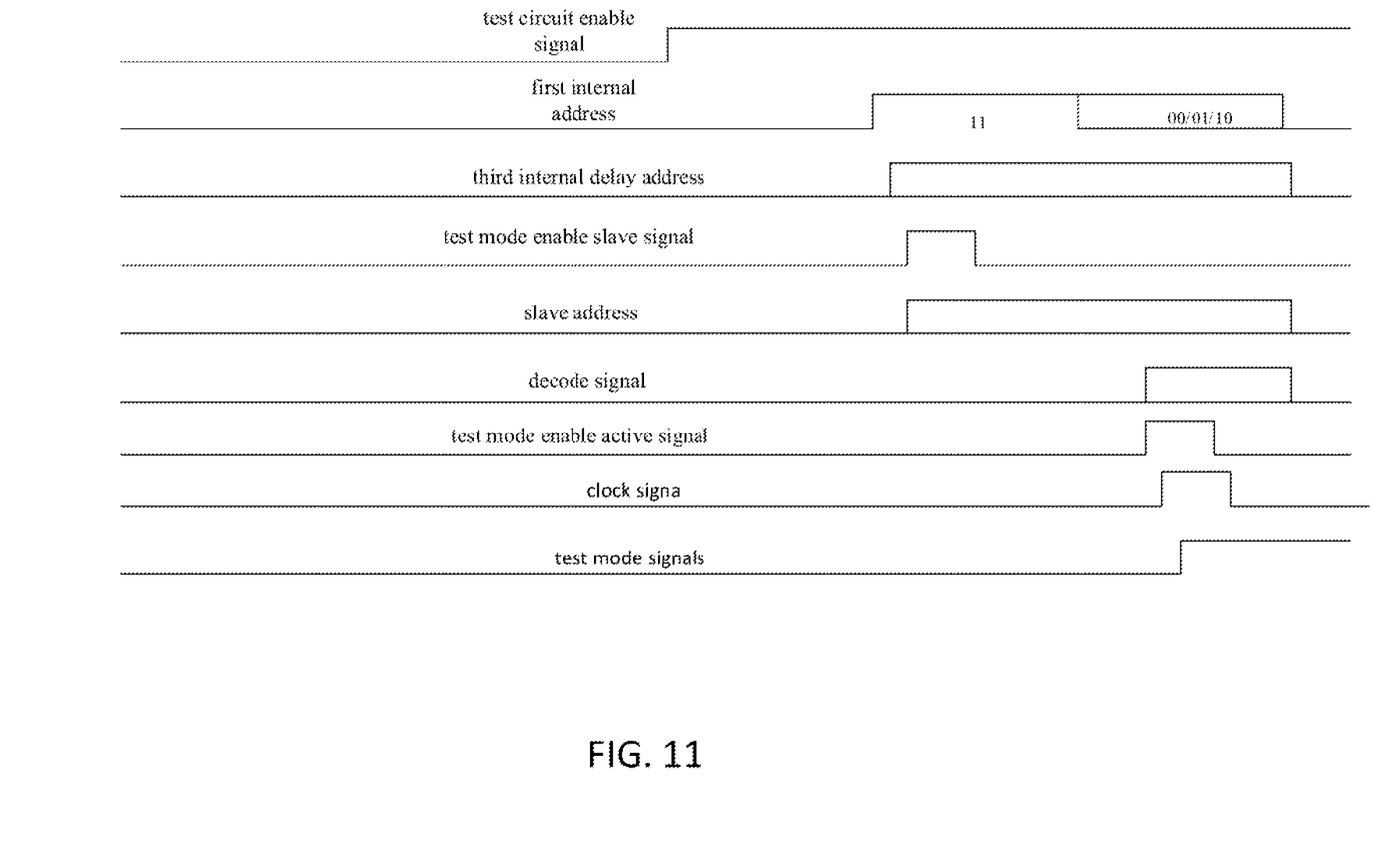
FIG. 11 is a timing sequence diagram of input and output signals of each unit in the test circuit shown in FIG. 4.

FIG. 11 is a timing diagram of the input and output signals of each unit in the test circuit shown in FIG. 5. FIG. 11 shows the time sequences of the input and output signals of each circuit in the test circuit shown in FIG. 5. First, referring to FIGS. 5 and 11, after the test circuit in the embodiment of the present application receives the test circuit enable signal, the test circuit starts to work, and the first address latch 21 receives the first internal address (A<1:0>), first receive the first internal address with the value "11", and the output value of the first address latch 21 is "11" the first internal delay address (RAT<1:0>). The command logic circuit 22 receives the test command and the second internal address (A<7>), and outputs the test mode command. The second address latch 23 receives the third internal address (A<7:0>) and the test mode command, and outputs the third internal delay address (RAD<7:0>) as shown in FIG. 11.

Next, the control logic circuit 24 performs an AND operation between the first internal delay address (RAT<1:0>) whose value is "11" and the test mode command to generate the test mode enable slave signal shown in FIG. 11, and output the mode enables the slave signal to the slave latch 26.

Next, the slave latch 26 receives the third internal delay address (RAD<7:0>) and the test mode enable slave signal, and outputs the slave address as shown in FIG. 11.

Next, the first address latch 21 receives the first internal address whose value is "00/01/10", and the output value of the first address latch 21 is "00/01/10" the first internal delay address (RAT<1:0>). The control logic circuit 24 reverses the first internal delay address (RAT<1:0>) whose value "00/01/10" and then performs an AND operation with the test mode command to generate the test mode enable active signal, and output the test mode Enable the active signal to the self-test circuit 27.

Next, the test decoding circuit 25 receives the first internal delay address (RAT<1:0>) and the third internal delay address (RAD<7:0>), and outputs the decoded signal as shown in FIG. 11.

Finally, the self-test circuit 27 receives the test mode enable active signal, the slave address and the decode signal, and performs logical operations according to the test mode enable active signal and the decode signal to generate the clock signal shown in FIG. 11, and generates the test mode signal shown in FIG. 11 according to the slave address and the clock signal, and finally outputs the test mode signal to the target circuit module.

Figure 12:
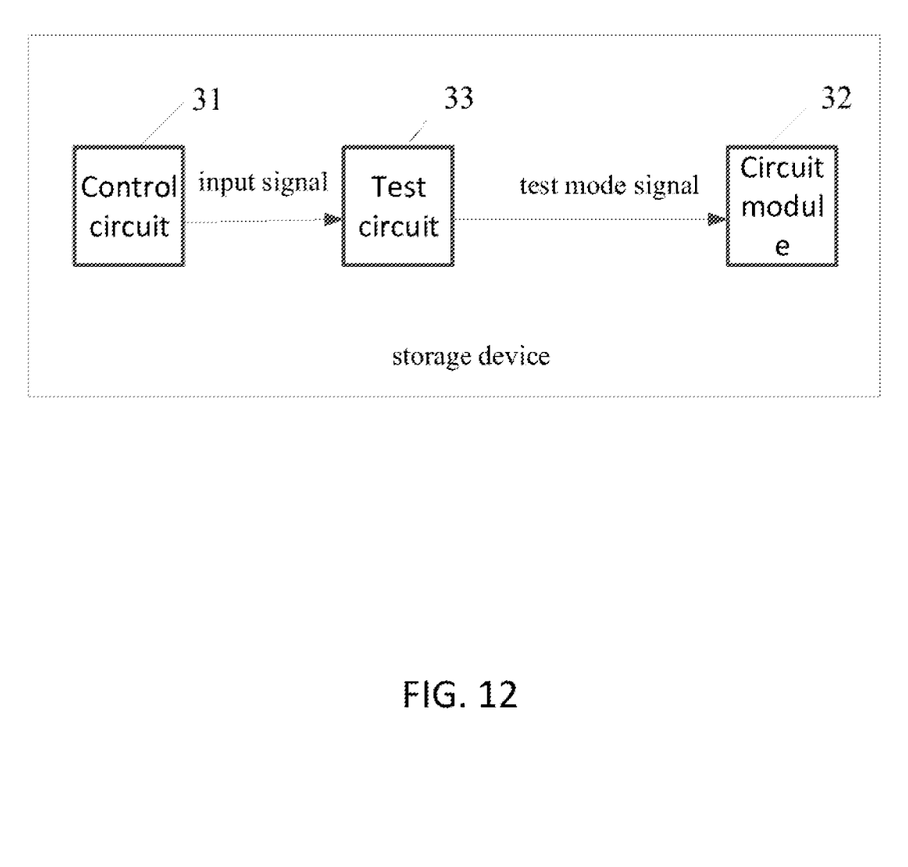
FIG. 12 is a schematic diagram of a mechanism of a memory chip functions provided by embodiment of the application.

The embodiment of the present application also provides a memory device. FIG. 12 is a schematic diagram of the mechanism of a memory device provided by an embodiment of the application. As shown in FIG. 12, the memory device of this embodiment may include a control circuit 31, at least one circuit module 32, and the test circuit 33 as described in the foregoing, embodiments.

Among thein, the control circuit 31 sends an input signal to the test circuit 33.

The test circuit 33 is configured to receive an input signal and send a test mode signal to one of the at least one circuit module 32 according to the input signal.

In the memory device provided by the pre-sent application, the test circuit in the memory device can accurately transmit the test mode signal to different circuit modules, and then can trigger the circuit module to perform a test corresponding to the test type carried by the test mode signal.

Finally, it should be noted that the above embodiments are only used to illustrate the technical solutions of the application, not to limit it; although the application has been described in detail with reference to the foregoing embodiments, those of ordinary skill in the art should understand that: the technical solutions described in the foregoing embodiments can still be modified, some or all of the technical features can be equivalently replaced; and these modifications or replacements do not make the essence of the corresponding technical solutions deviate from the technical solutions of the embodiments of the application scope.

The invention claimed is:

1. A test circuit comprising:
an input terminal, a processing circuit and an output terminal;
wherein the input terminal receives an input signal, wherein the input signal comprises a test command to instruct a test target circuit module and an address of a target circuit module;
wherein the processing circuit is configured to determine a test mode signal according to the test command and the address of the target circuit module, wherein the test mode signal carries a test type, wherein the test mode signal triggers the target circuit module to perform a test according to the test type; and
wherein the output terminal sends the test mode signal to the target circuit module according to the address of the target circuit module;
wherein the processing circuit comprises:
a first address latch, a second address latch, a command logic circuit, a control logic circuit, a test decoding circuit and a slave latch;
wherein the first address latch receives a first internal address and outputs a first internal delay address;
wherein the command logic circuit receives the test command and a second internal address, and outputs a test mode command; and
wherein the second address latch receives a third internal address and the test mode command, and outputs a third internal delay address;
wherein the control logic circuit is configured to receive the first internal delay address and the test mode command, and outputs a test mode enable active signal and a test mode enable slave signal;
wherein the test decoding circuit is configured to receive the first internal delay address and the third internal delay address, and outputs a decoding signal; and
wherein the slave latch receives the third internal address and the test mode enable slave signal, and outputs a slave address.

2. A test circuit comprising: an input terminal, a processing circuit and an output terminal;
wherein the input terminal receives an input signal, wherein the input signal comprises a test command to instruct a test target circuit module and an address of a target circuit module;
wherein the processing circuit is configured to determine a test mode signal according to the test command and the address of the target circuit module, wherein the test mode signal carries a test type, wherein the test mode signal triggers the target circuit module to perform a test according to the test type; and
wherein the output terminal sends the test mode signal to the target circuit module according to the address of the target circuit module;
a first address latch, a second address latch, and a command logic circuit;
wherein the first address latch receives a first internal address and outputs a first internal delay address;
wherein the command logic circuit receives the test command and a second internal address, and outputs a test mode command; and
wherein the second address latch receives a third internal address and the test mode command, and outputs a third internal delay address.

3. The test circuit according to claim 2, wherein the processing circuit further comprises:
a control logic circuit, a test decoding circuit and a slave latch;
wherein the control logic circuit is configured to receive the first internal delay address and the test mode command, and outputs a test mode enable active signal and a test mode enable slave signal;
wherein the test decoding circuit is configured to receive the first internal delay address and the third internal delay address, and outputs a decoding signal; and
wherein the slave latch receives the third internal address and the test mode enable slave signal, and outputs a slave address.

4. The test circuit according to claim 1, wherein the processing circuit further comprises:
a self-test circuit, wherein the self-test circuit receives the test mode enable active signal, the slave address and the decoding signal, and outputs the test mode signal to the target circuit module.

5. The test circuit according to claim 4, wherein the command logic circuit generates the test mode command when a value of the second internal address is a preset value.

6. The test circuit according to claim 4, wherein the control logic circuit performs:
   a logical operation with the test mode command to generate the test mode enable active signal when a value of the first internal delay address is a first value; and
   a logic operation with the test mode command to generate the test mode enable slave signal when a value of the first internal delay address is a second value.

7. The test circuit according to claim 4, wherein the test decoding circuit comprises a plurality of decoders.

8. The test circuit according to claim 7, wherein the plurality of decoders comprises 3-8 decoders.

9. The test circuit according to claim 4,
   wherein the control logic circuit comprises a first NAND gate, a first inverter, a second NAND gate, a second inverter, a third NAND gate, and a third inverter;
   wherein an output terminal of the first NAND gate is connected with an input terminal of the first inverter, an output terminal of the second NAND gate is connected with an input terminal of the second inverter, and an output terminal of the third NAND gate is connected to an input terminal of the third inverter;
   wherein the first NAND gate receives the first internal delay address and outputs a first signal;
   wherein the first inverter receives the first signal and outputs a second signal;
   wherein the second NAND gate receives the first signal and the test mode command, and outputs a third signal;
   wherein the second inverter receives the third signal and outputs the test mode enable active signal;
   wherein the third NAND gate receives the second signal and the test mode command, and outputs a fourth signal; and
   wherein the third inverter receives the fourth signal and outputs the test mode enable slave signal.

10. The test circuit according to claim 4, wherein the self-test circuit comprises a first test sub-circuit, wherein the first test sub-circuit comprises a first logic control sub-circuit and a first latch group of latches, and wherein the first logic control sub-circuit is connected to the first latch group.

11. The test circuit according to claim 10,
    wherein an input terminal of the first logic control sub-circuit is connected to an output terminal of the control logic circuit, an output terminal of the test decoding circuit and an output terminal of the slave latch; and
    wherein the first logic control sub-circuit performs a logic operation according to the test mode enable active signal and the decoding signal to generate a clock signal and outputs the clock signal to the first latch group.

12. The test circuit according to claim 11, wherein the first latch group receives the slave address and the clock signal, and wherein a test mode is determined according to the slave address and the clock signal, and outputs the test mode signal to the target circuit module.

13. The test circuit according to claim 10,
    wherein the first logic control sub-circuit includes a first P-type transistor, a first N-type transistor, a second N-type transistor, a third N-type transistor, and a fourth N-type transistor;
    wherein a control terminal of the first P-type transistor is connected to an output terminal of the control logic circuit, wherein a first terminal of the first P-type transistor is connected to a power terminal, and wherein a second terminal of the first P-type transistor is connected to an input terminal of the first latch group and a first terminal of the first N-type transistor;
    wherein a control terminal of the first N-type transistor, a control terminal of the second N-type transistor, and a control terminal of the third N-type transistor are all connected to an output terminal of the test decoding circuit;
    wherein a second terminal of the first N-type transistor is connected to a first terminal of the second N-type transistor, wherein a second terminal of the second N-type transistor is connected to a first terminal of the third N-type transistor, wherein a second terminal of the third N-type transistor is connected to a first terminal of the fourth N-type transistor;
    wherein a control terminal of the fourth N-type transistor is connected to an output terminal of the control logic circuit, therein a first terminal of the fourth N-type transistor is connected to a second terminal of the third N-type transistor, and
    wherein a second terminal of the fourth N-type transistor is connected to the ground terminal.

14. The test circuit according to claim 4, wherein the first internal address is 2 bits, the second internal address is 1 bit, and the third internal address is 7 bits.

15. A memory device, comprising a control circuit, at least one circuit module, and the test circuit according to claim 1;
    wherein the control circuit send an input signal to the test circuit; and
    wherein the test circuit is further configured to receive the input signal, and sends the test mode signal to one of the at least one circuit module according to the input signal.

16. The test circuit according to claim 3, wherein the processing circuit further comprises:
    a self-test circuit, wherein the self-test circuit receives the test mode enable active signal, the slave address and the decoding signal, and outputs the test mode signal to the target circuit module.

17. The test circuit according to claim 16, wherein the command logic circuit generates the test mode command when a value of the second internal address is a preset value.

18. The test circuit according to claim 16, wherein the control logic circuit performs:
    a logical operation with the test mode command to generate the test mode enable active signal when a value of the first internal delay address is a first value; and
    a logic operation with the test mode command to generate the test mode enable slave signal when a value of the first internal delay address is a second value.

19. The test circuit according to claim 16,
    wherein the control logic circuit comprises a first NAND gate, a first inverter, a second NAND gate, a second inverter, a third NAND gate, and a third inverter;
    wherein an output terminal of the first NAND gate is connected with an input terminal of the first inverter, an output terminal of the second NAND gate is connected with an input terminal of the second inverter, and an output terminal of the third NAND gate is connected to an input terminal of the third inverter;
    wherein the first NAND gate receives the first internal delay address and outputs a first signal;
    wherein the first inverter receives the first signal and outputs a second signal;
    wherein the second NAND gate receives the first signal and the test mode command, and outputs a third signal;

wherein the second inverter receives the third signal and outputs the test mode enable active signal;

wherein the third NAND gate receives the second signal and the test mode command, and outputs a fourth signal; and wherein the third inverter receives the fourth signal and outputs the test mode enable slave signal.

20. The test circuit according to claim 16, wherein the self-test circuit comprises a first test sub-circuit, wherein the first test sub-circuit comprises a first logic control sub-circuit and a first latch group of latches, and wherein the first logic control sub-circuit is connected to the first latch group.

* * * * *